United States Patent
Song et al.

(10) Patent No.: US 6,580,134 B1
(45) Date of Patent: Jun. 17, 2003

(54) FIELD EFFECT TRANSISTORS HAVING ELEVATED SOURCE/DRAIN REGIONS

(75) Inventors: Won-sang Song, Seoul (KR); Jung-woo Park, Seoul (KR); Gil-gwang Lee, Kyungki-do (KR); Tae-hee Choe, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/680,805

(22) Filed: Oct. 6, 2000

(30) Foreign Application Priority Data

Oct. 7, 1999 (KR) ......................................... 1999-43210

(51) Int. Cl.[7] .......................... H01L 29/76; H01L 29/94; H01L 31/062; H01L 31/119; H01L 29/113; H01L 21/20; H01L 21/36; H01L 21/336
(52) U.S. Cl. ...................... 257/384; 257/382; 257/330; 438/489; 438/300
(58) Field of Search .................. 257/330, 331, 257/382–385; 438/489, 300, 368

(56) References Cited

U.S. PATENT DOCUMENTS

| | | | |
|---|---|---|---|
| 4,998,150 A | | 3/1991 | Rodder et al. |
| 5,200,352 A | * | 4/1993 | Pfiester ........................ 257/344 |
| 5,677,214 A | * | 10/1997 | Hsu ........................ 257/29.04 |
| 5,908,313 A | * | 6/1999 | Chau et al. ............. 257/29.021 |
| 5,915,183 A | * | 6/1999 | Gambino et al. ....... 257/29.122 |
| 6,114,209 A | * | 9/2000 | Chu et al. .............. 257/29.122 |

* cited by examiner

Primary Examiner—Tom Thomas
Assistant Examiner—Samuel A Gebremariam
(74) Attorney, Agent, or Firm—Myers Bigel Sibley & Sajovec

(57) ABSTRACT

Field effect transistors (FETs) include an integrated circuit substrate having a surface, and a gate on the surface. A pair of recessed regions in the substrate are located beneath the surface. Respective ones of the recessed regions are located on respective opposite sides of the gate. Each of the recessed regions define a sidewall and a floor. An elevated source/drain structure on each of the recessed regions is at least as thick adjacent to the gate as remote from the gate. A gate spacer may be included between the gate and the elevated source/drain region. The gate spacer can comprise an insulating film. Preferably, the source/drain structure extends to the sidewall of the recessed region. The elevated source/drain structure is preferably free of a facet adjacent the gate. The present invention also relates to methods for fabricating a field effect transistors (FET) having an elevated source/drain structure. These methods may comprise the steps of: providing a integrated circuit substrate having a surface and a gate on the integrated circuit substrate; subsequently removing portions of the integrated circuit substrate to form a pair of recessed regions below the surface of the integrated circuit substrate, the recessed region being defined by a floor and sidewall in the integrated circuit substrate; and epitaxially growing a layer on the floor and sidewall of each recessed region.

26 Claims, 3 Drawing Sheets

FIELD EFFECT TRANSISTORS HAVING ELEVATED SOURCE/DRAIN REGIONS

RELATED APPLICATIONS

This application is related to Korean Application No. 99-43210, filed Oct. 7, 1999, the disclosure of which is hereby incorporated herein by reference.

FIELD OF THE INVENTION

The present invention relates to integrated circuit devices and fabrication methods thereof, and more particularly, to field effect transistor (FETs) and fabrication methods for field effect transistors.

BACKGROUND OF THE INVENTION

As the integration density of integrated circuits continues to increase, the size of Field Effect Transistors (FET), such Metal Oxide Semiconductor Field Effect Transistors (MOSFETs), implemented in such integrated circuits may also decrease. However, a decrease in the size of a MOSFET may reduce the MOSFET's channel length. As appreciated by those skilled in the art, a reduction in the MOSFET's channel length may cause a "short channel effect" (SCE) which may increase the likelihood of a phenomenon known as "punch through" between a source and a drain of the MOSFET.

Short channel effects may arise when the depletion region widths of the source and drain junctions become comparable to the channel length. As a result, the potential distribution in the channel may become two-dimensional which can result in large values of sub-threshold current, a decrease in threshold voltage, and/or non-saturation of drain current due to punch through. Punch through may occur when the sum of the source and drain depletion widths exceed the channel length, thereby causing the channel to be punched through (i.e., the depletion region punches through the neutral n-region) when voltage is applied. Thus, since "short channel effects" may complicate device operation and may degrade device performance, it may be desirable to reduce these effects.

In order to reduce the SCE and "punch through", semiconductor devices have been produced using a technique conventionally known as Selective Epitaxial Growth (SEG). SEG may be used to form an epitaxial layer having an elevated source/drain structure. However, using SEG may result in the formation of a "facet" at the edge of the epitaxial layer. During subsequent ion implantation and thermal treatment, that are used when forming source/drain impurity regions, these facets may cause the electrical characteristics of the resultant semiconductor devices to deteriorate. Problems with the conventional SEG techniques will now be further discussed with reference to FIG. 1.

FIG. 1 shows a cross-sectional view of an FET having an elevated source/drain structure fabricated using conventional SEG techniques. A gate pattern including a gate oxide film 55, a gate electrode 57 and gate spacers 61 are formed on an integrated circuit substrate such as a silicon semiconductor substrate 51 in which an isolation film 53 has been formed by trench isolation. An epitaxial layer 59 is then formed by an SEG process on both sides of the gate pattern and on areas of the semiconductor substrate 51. When ion implantation is performed using the gate pattern as an ion implantation mask, and thermal treatment is performed to activate implanted impurities, an impurity profile 63 is formed in the source/drain region. One problem with this conventional process for fabricating an FET is the formation of a facet A at the edge of the epitaxial layer 59. Such a facet A may undesirably result the formation of a non-uniform impurity region B in the impurity profile 63 at the source/drain region. As shown in FIG. 1, this non-uniform impurity region B has a locally-deep junction which can increase the likelihood of "short channel effects" in the FET which can in turn cause "punch through". As discussed above, these problems may ultimately degrade the electrical characteristics of the semiconductor device.

One method for fabricating an FET was disclosed in U.S. Pat. No. 4,998,150 to Rodder et al., entitled "RAISED SOURCE/DRAIN TRANSISTOR." According to this method, a raised source/drain transistor is provided having thick sidewall spacing insulators adjacent the transistor gate. A first sidewall spacer is disposed adjacent thin sidewall spacing insulator and raised source/drain region. A second sidewall spacer is formed at the interface between field insulating region and raised source/drain region. Unfortunately, the area occupied by the source/drain region may be reduced by the area occupied by the additional sidewall spacer which may, in turn, influence the impurity profile that is formed in the source/drain region. Moreover, this method may be complicated since an additional process step for forming the additional sidewall spacer may need to be performed.

SUMMARY OF THE INVENTION

Preferred embodiments of the present invention comprise field effect transistors (FETs) that include an integrated circuit substrate having a surface, and a gate on the surface. A pair of recessed regions in the substrate are located beneath the surface. A respective one of the recessed regions is located on a respective opposite side of the gate. Each of the recessed regions define a sidewall and a floor. An elevated source/drain structure on each of the recessed regions is at least as thick adjacent to the gate as remote from the gate. A gate spacer may be included between the gate and the elevated source/drain region. The gate spacer can comprise an insulating film.

Preferably, the elevated source/drain structure extends to the sidewall of the recessed region. The elevated source/drain structure is preferably free of a facet adjacent the gate. The elevated source/drain structure adjacent the gate is preferably at least as thick as the elevated source/drain structure remote from the gate. The source/drain structure may have a substantially constant thickness remote from the gate. In other embodiments, the elevated source/drain structure on each of the recessed regions is thicker adjacent the gate than remote from the gate. The elevated source/drain structure preferably increases in thickness towards the gate, and/or can also increase in slope towards the gate. In other words, the elevated source/drain structure preferably extends further away from the floor adjacent the gate than remote from the gate.

Embodiments of the present invention also relate to methods for fabricating a field effect transistor (FET) having an elevated source/drain structure. These embodiments can comprise the steps of: providing an integrated circuit substrate having a surface and a gate on the surface; removing portions of the integrated circuit substrate to form a pair of recessed regions below the surface of the integrated circuit substrate, a respective one of which is located on a respective opposite side of the gate, the recessed region being defined by a floor and sidewall in the integrated circuit substrate; and epitaxially growing a layer on the floor and sidewall of each recessed region.

The step of epitaxially growing may comprise growing the layer such that the layer extends from the sidewall of the recessed region. Since the recessed region is defined by a floor and a sidewall, the step of epitaxially growing preferably results in growing the layer such that the layer is free of a facet adjacent the gate. For instance, the step of epitaxially growing may comprise growing the layer such that the epitaxial layer having a first thickness growth rate adjacent the gate and a second thickness growth rate remote from the gate, the second thickness growth rate being greater than the first thickness growth rate. As a result, during the step of epitaxially growing, the layer may be grown such that the layer adjacent the gate is at least as thick as the layer is remote from the gate, and optionally the step of epitaxially growing may comprise growing the layer such that the layer has a substantially constant thickness remote from the gate. The epitaxial layer adjacent the gate may be grown such that the thickness is equal to or greater than the thickness of the epitaxial layer remote from the gate. Preferably, the step of epitaxially growing comprises growing the layer such that the layer increases in thickness towards the gate. This step may also comprise growing the layer such that the height of the layer increases faster adjacent the gate than remote from the gate. The growing step may also comprise growing the layer such that the slope of the epitaxial layer is greater adjacent the gate than remote from the gate, and/or growing the layer such that the layer increases in slope towards the gate.

Methods for fabricating a field effect transistor (FET), may further comprise the step of placing a gate spacer between the gate and the layer, which can be accomplished by depositing a dielectric film on the surface of the integrated circuit substrate and the gate, and then removing selected portions of the dielectric film and leaving other portions of the dielectric film that contact the gate to form the gate spacer on a sidewall of the gate. Following the step of providing, the method may also comprise the step of: performing primary ion implantation to form a lightly doped drain (LDD) region on the surface of the integrated circuit substrate. A secondary ion implantation may also be performed into the epitaxial layer.

An impurity concentration of an upper portion of the epitaxial layer may be substantially the same as an impurity concentration of a lightly doped drain (LDD) area, while an impurity concentration of a lower portion of the epitaxial layer is preferably greater than an impurity concentration of the upper portion of the epitaxial layer. The amount of impurities implanted during the secondary ion implantation is preferably the same as the amount present in the lower portion of the epitaxial layer during formation of the epitaxial layer, while the amount of impurities implanted during the primary ion implantation is preferably the same as the amount present in the upper portion of the epitaxial layer during formation of the epitaxial layer.

According to the preferred embodiments present invention, formation of a facet adjacent to the gate pattern may be prevented which can thereby reduce or prevent the unintended generation of an erratic impurity profile in the channel region of a transistor. In turn, this may prevent short channel effects and punch through. As a result, the electrical characteristics of an FET device having an elevated source/drain structure can be greatly improved.

DESCRIPTION OF THE PREFERRED EMBODIMENT

Figure 1:
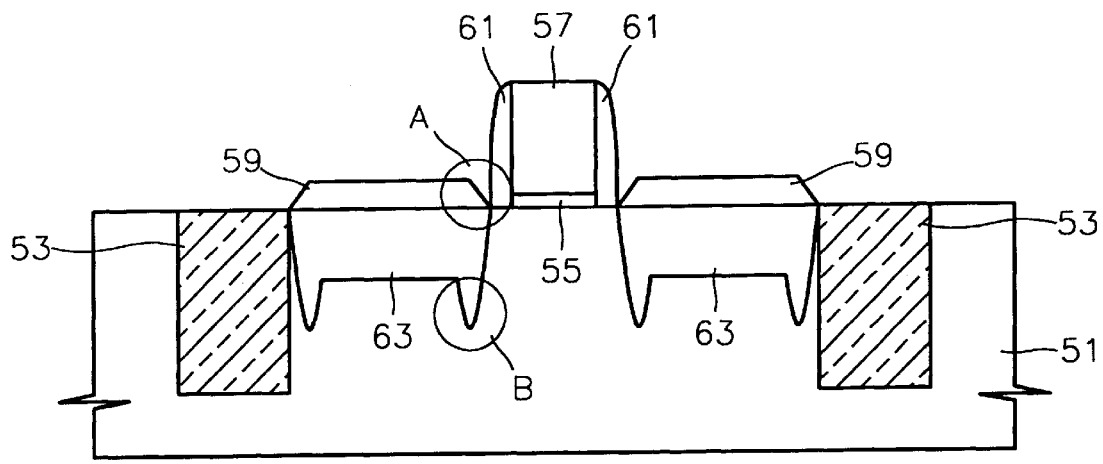
FIG. 1 is a cross-sectional view of an FET having an elevated source/drain structure for explaining problems with a conventional process of fabricating the same.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

The present invention can be realized in other manners without departing from the spirit and indispensable features of the present invention. For example, in a preferred embodiment, a gate pattern is formed by sequentially stacking a gate oxide film, a gate electrode and a capping layer and forming a gate spacer on the sidewalls of the stacked layer. A gate pattern mentioned in the present specification is used in the broadest meaning, and is not restricted to specific shapes as described in the following preferred embodiments. Also, in the preferred embodiment, the capping layer in the gate stack is an oxide film, but can be replaced by a dielectric film. Alternatively, a capping layer does not have to be utilized. A dielectric film for a gate spacer can also be replaced by another film material. Therefore, the contents described in the preferred embodiment are just examples, and do not limit the present invention.

Figure 2:
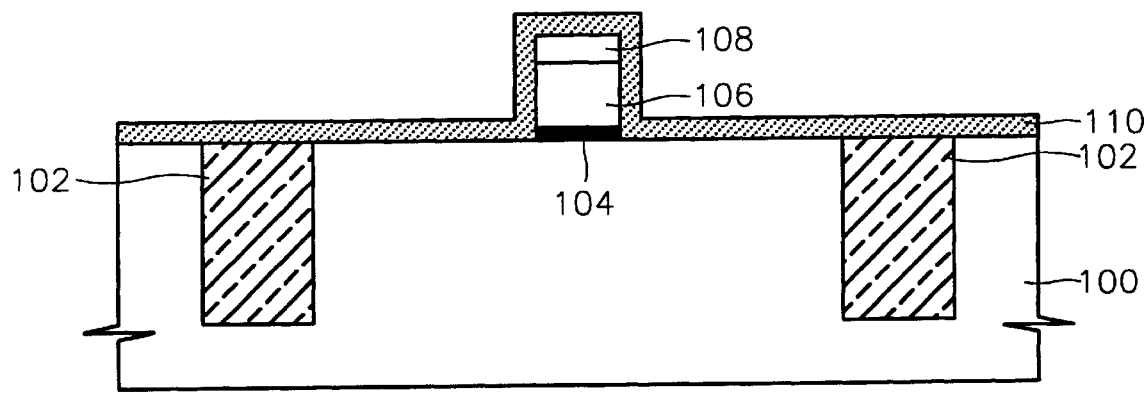
FIGS. 2 through 7 are cross-sectional views of FETs according to embodiments of the invention during intermediate fabrication steps.

Referring to FIG. 2, an isolation film 102 is formed on an integrated circuit substrate, such as a silicon semiconductor substrate, by a typical method. A gate stack may include a gate oxide film 104, a gate electrode 106 and/or a capping layer 108 is formed on an active region defined by the isolation film 102. The gate electrode 106 can be formed of doped polysilicon, and the capping layer 108 can be an oxide layer or a multiple layer including an oxide layer. Then, a Lightly Doped Drain (LDD) region having a shallow junction is formed on the surface of the integrated circuit substrate by performing primary ion implantation using the gate stack as an ion implantation mask.

A dielectric film 110 for forming a gate spacer is formed to have a uniform thickness on the entire surface of the integrated circuit substrate having the gate stack formed thereon. Preferably, the dielectric film 110 is a single layer such as a nitride film, an oxide film, or an oxynitride film (SiON), or a multiple layer including a nitride film, an oxide film and an oxynitride film.

Figure 3:
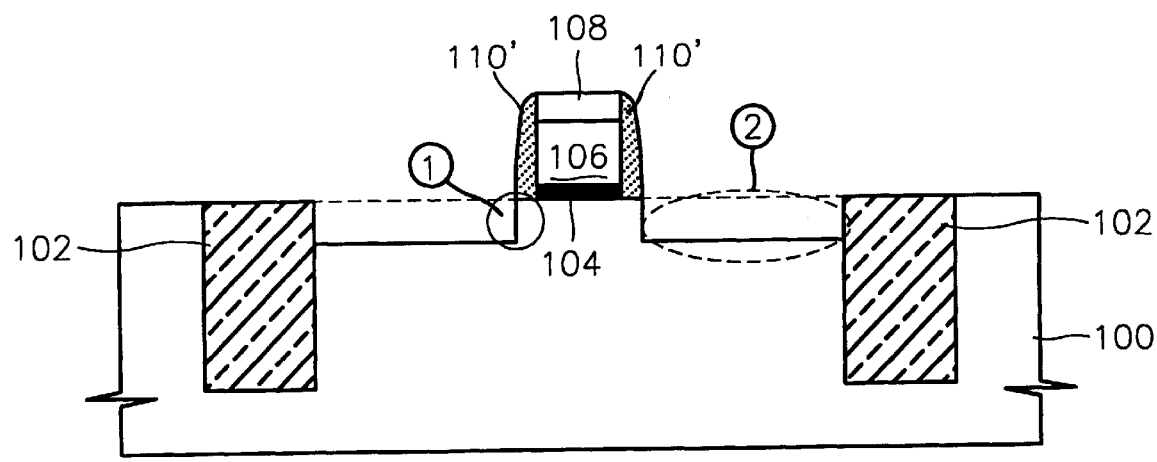

Referring to FIG. 3, gate spacers 110' are formed by performing anisotropic over etching of the integrated circuit substrate on which the dielectric film 110 for forming gate spacers has been formed, while part of the integrated circuit substrate 100 is etched below the surface at source and drain regions. When the gate spacer 110' is formed, part of the integrated circuit substrate 100 is removed by anisotropic over etching in order to extend seed surfaces of silicon, which grow during subsequent selective epitaxial growth, on the sidewall surface and the floor surface. Over etching of part of the integrated circuit substrate 100 below the surface of the integrated circuit substrate can be accomplished by an etch method applied to the material and the capping layer 108.

Figure 4:
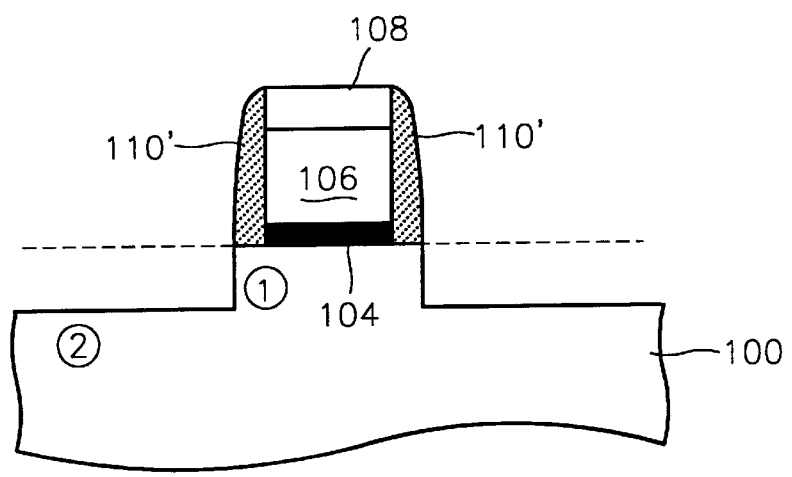

Referring to FIG. 4, which is a magnified view of the gate pattern portion of FIG. 3, since part of the integrated circuit substrate 100 was etched below the surface of the integrated circuit substrate 100, silicon can be grown from two seed surfaces by selective epitaxial growth. One seed surface is the sidewall surface (①) of a recessed region, and the other seed surface is the floor (②) thereof. Here, the depth to which the integrated circuit substrate 100 is etched to a depth such that the finally grown epitaxial layer has a slope greater than zero at an area adjacent to the gate pattern and/or further rises in a direction of the gate pattern when an epitaxial layer has been selectively grown simultaneously on the sidewall surface (①) and the floor (②). The height of an epitaxial layer grown on the sidewall surface (①) is preferably equal to or greater than that of an epitaxial layer grown on the floor (②).

Figure 5:
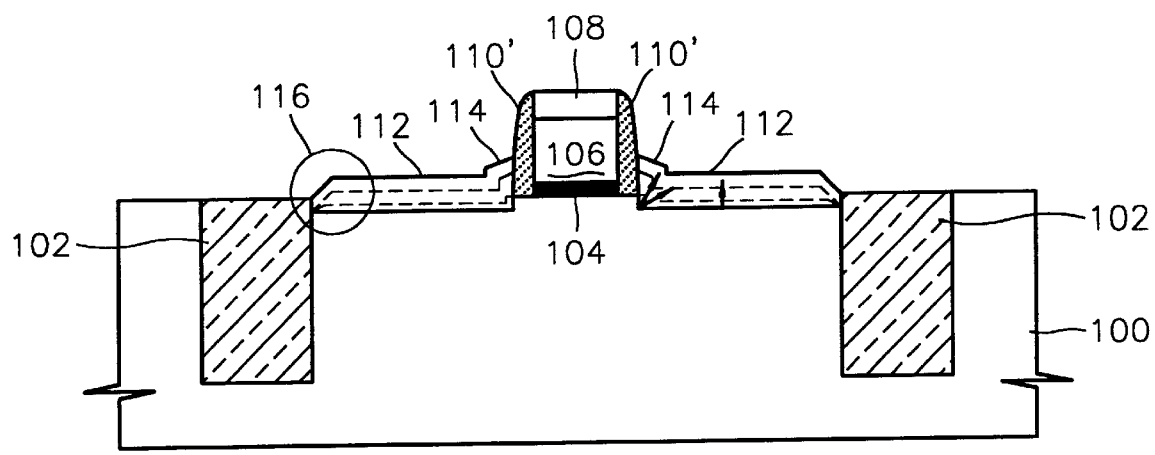

Referring to FIG. 5, a source/drain region is grown on the floor (②) and the sidewall surface (①) by selective epitaxial growth. The source/drain region should preferably extend to the sidewall surface (①) such that the source/drain region is at least as thick adjacent the gate as remote from the gate, and should preferably increase in thickness and/or slope towards the gate. For purposes of discussion, the source/drain region will now be divided into first and second source/drain regions 112 and 114. As shown in FIG. 5, a second source/drain region 114 is formed adjacent to the gate pattern on the sidewall surface (①), and a first source/drain region preferably having a constant height, is formed on the remaining portions. However, a facet 116 may be formed at a contacting portion of the selectively-grown epitaxial layer and the isolation film 102, since the material of the isolation film 102 is not silicon. Hence, in the present invention, it is preferable that the height of the second source/drain region 114 is equal to or greater than that of the first drain region 112. Such an arrangement helps make the source/drain region free of a facet adjacent the gate.

Then, secondary ion implantation is performed on the first and second source/drain regions 112 and 114 formed by the selective epitaxial growth, using the gate pattern preferably including the gate spacer 110' as an ion implantation mask. Again, due to the elevated structure of the second source/drain region, a facet is not formed adjacent the gate pattern.

The primary and secondary ion implantation processes may not need to be performed if an impurity profile is formed, by growing an epitaxial layer containing impurities, in situ, during the subsequent selective epitaxial growth process. That is, an epitaxial layer should preferably be grown by adding impurities in situ, in a chamber for growing an epitaxial layer. The impurity concentration of the lower portion of the epitaxial layer can be controlled to be at a high level, while the impurity concentration of the upper portion thereof can be controlled to be at a low level, which is substantially the same as the impurity concentration of a lightly doped drain (LDD) area. Thus, the same amount of impurities, as the dose of impurities implanted into the surface of an integrated circuit substrate upon the secondary ion implantation, are preferably included in the lower portion of the epitaxial layer. Similarly, the same amount of impurities, as the dose of impurities implanted into the surface of the integrated circuit substrate upon the primary ion implantation, are preferably included in the upper portion of the epitaxial layer while the epitaxial layer is formed. If during anisotropic over etching, a well region is etched into, the lower portion of the epitaxial layer is preferably grown so as to include the same amount of impurities as a dose corresponding to the well region.

Figure 6:
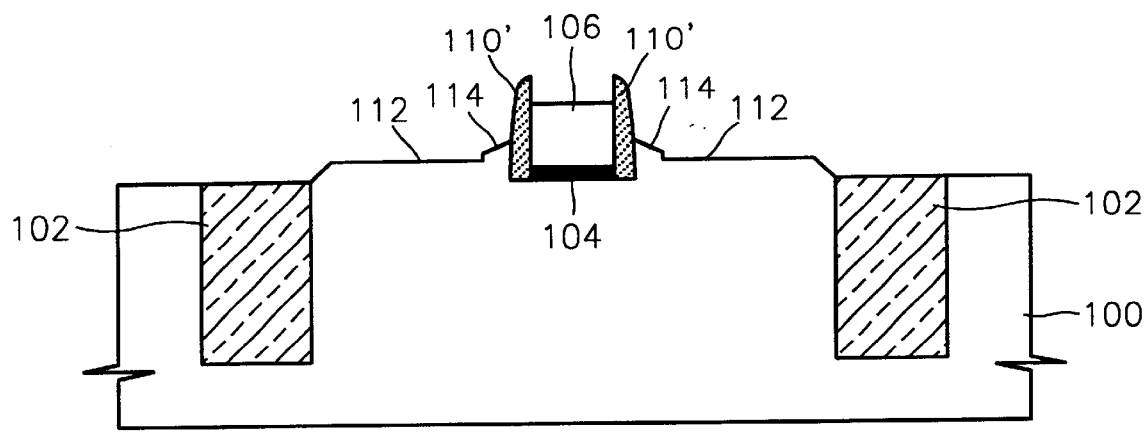

Referring to FIG. 6, the capping layer 108 of FIG. 5 included in the gate pattern is etched from an integrated circuit substrate on which the first and second source/drain regions 112 and 114 have been formed.

Figure 7:
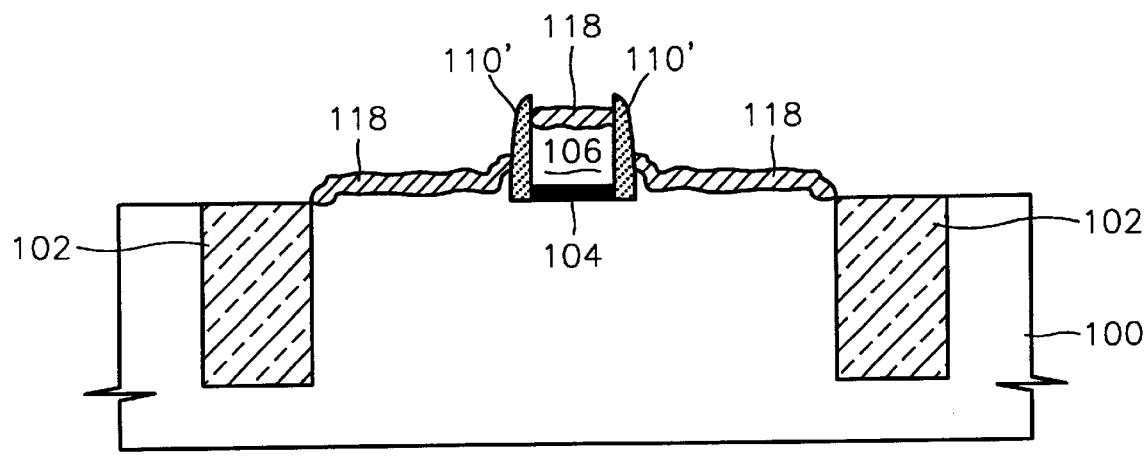

Referring to FIG. 7, the entire surface of the integrated circuit substrate from which the capping layer has been removed is coated with a metal layer for forming silicide, and then thermally processed. During the thermal processing, a silicide layer 118 is formed on the gate electrode 106, which is an area where silicon is exposed, and also on the first and second source/drain regions 112 and 114. However, no silicide layer is formed on the gate spacer 110' having a dielectric film. A metal layer is removed by a successive cleaning process on the portion having no silicide layer.

According to the embodiment of the present invention described above, abnormal formation of an impurity profile at a source/drain region can be reduced or prevented by improving the shape of an epitaxial layer grown adjacent to a gate pattern such that the epitaxial layer, which eventually becomes the source/drain region, is free of a facet adjacent the gate. Preventing formation of a facet may prevent a short channel effect (SCE), may reduce the likelihood of punch through, and/or may reduce the likelihood of a shallow junction at the source/drain region.

In the drawings and specification, there have been disclosed typical preferred embodiments of the invention and, although specific terms are employed, they are used in a generic and descriptive sense only and not for purposes of limitation, the scope of the invention being set forth in the following claims. Although the invention has been described with reference to a particular embodiment, it will be apparent to one of ordinary skill in the art that modifications of the described embodiment may be made without departing from the spirit and scope of the invention.

What is claimed is:

1. A field effect transistor, comprising:
    an integrated circuit substrate having a surface;
    a gate on the surface;
    a pair of recessed regions in a portion of the substrate located beneath the surface of remaining portions of the substrate, a respective one of which is located on a respective opposite side of the gate, each recessed region defing a sidewall and a floor; and
    an elevated monocrystalline source/drain structure in each of the recessed regions, wherein the monocrystalline source/drain structure adjacent the gate increases in thickness towards the gate.

2. The field effect transistor, as recited in claim 1, wherein the source/drain structure extends to the sidewall of the recessed region.

3. The field effect transistor, as recited in claim 1, wherein the elevated source/drain structure is free of a facet adjacent the gate.

4. The field effect transistor, as recited in claim 1, wherein the elevated source/drain structure adjacent the gate is at least as thick as the elevated source/drain structure remote from the gate.

5. The field effect transistor, as recited in claim 1, wherein the source/drain structure has a substantially constant thickness remote from the gate.

6. The field effect transistor, as recited in claim 1, wherein the elevated source/drain reg in includes an oblique slope towards the gate.

7. The field effect transistor, as recited in claim 1, further comprising a gate spacer between the gate and the elevated source/drain region.

8. The field effect transistor, as recited in claim 7, wherein the gate spacer comprises an insulating film.

9. A field effect transistor, comprising:
- an integrated circuit substrate having a surface;
- a gate on the surface;
- a pair of recessed regions in a portion of the substrate located beneath the surface of remaining portions of the substrate, a respective one of which is located on respective opposite side of the gate, each recessed region defining a sidewall and a floor; and
- an elevated monocrystaline source/drain structure in each of the recessed regions, wherein the monocrystalline source/drain structure is thicker adjacent the gate than remote from the gate.

10. The field effect transistor, as recited in claim 9, wherein the source/drain structure extends to the sidewall of the recessed region.

11. The field effect transistor, as recited in claim 9, wherein the elevated source/drain structure is free of a facet adjacent the gate.

12. The field effect transistor, as recited in claim 9, wherein the elevated source/drain structure increases in thickness towards the gate.

13. The field effect transistor, as recited in claim 9, wherein the source/drain structure has a substantially constant thickness remote from the gate.

14. The field effect transistor, as recited in claim 9, wherein the elevated source/drain structure increases non-linearly in thickness towards the gate.

15. The field effect transistor, as recited in claim 9, wherein the elevated source/drain region includes an oblique slope towards the gate.

16. The field effect transistor, as recited in claim 9, further comprising a gate spacer between the gate and the elevated source/drain region.

17. The field effect transistor, as recited in claim 16, wherein the gate spacer comprises an insulating film.

18. A field effect transistor, comprising:
- an integrated circuit substrate having a surface;
- a gate on the surface;
- a pair of recessed regions in a portion of the substrate located beneath the surface of remaining portions of the substrate, a respective one of which is located on a respective opposite sides of the gate, each recessed region defining a sidewall and a floor; and
- an elevated monocrystalline source/drain structure in each of the recessed regions, wherein the monocrystalline source/drain structure extends further away from the bottom surface adjacent the gate than remote from the gate.

19. The field effect transistor, as recited in claim 18, wherein the source/drain structure extends to the sidewall of the recessed region.

20. The field effect transistor, as recited in claim 18, wherein the elevated source/drain structure is free of a facet adjacent the gate.

21. The field effect transistor, as recited in claim 18, wherein the elevated source/drain structure adjacent the gate is at least as thick as the elevated source/drain structure remote from the gate.

22. The field effect transistor, as recited in claim 18, wherein the source/drain structure has a substantially constant thickness remote from the gate.

23. The field effect transistor, as recited in claim 18, wherein the elevated source/drain structure increases in thickness towards the gate.

24. The field effect transistor, as recited in claim 18, wherein the elevated source/drain region includes an oblique slope towards the gate.

25. The field effect transistor, as recited in claim 18, further comprising a gate spacer between the gate and the elevated source/drain region.

26. The field effect transistor, as recited in claim 25, wherein the gate spacer comprises an insulating film.

* * * * *

UNITED STATES PATENT AND TRADEMARK OFFICE
CERTIFICATE OF CORRECTION

PATENT NO.     : 6,580,134 B1                                                    Page 1 of 1
DATED          : June 17, 2003
INVENTOR(S)    : Song et al.

It is certified that error appears in the above-identified patent and that said Letters Patent is hereby corrected as shown below:

<u>Column 7,</u>
Line 5, should read -- the elevated source/drain region includes an oblique slope --

Signed and Sealed this

Twenty-fifth Day of November, 2003

JAMES E. ROGAN
*Director of the United States Patent and Trademark Office*